(12) United States Patent
Mimoto et al.

(10) Patent No.: US 6,949,969 B2
(45) Date of Patent: Sep. 27, 2005

(54) SEMICONDUCTOR DEVICE HAVING RELIEF CIRCUIT FOR RELIEVING DEFECTIVE PORTION

(75) Inventors: Kenichiro Mimoto, Yokohama (JP); Takehiko Hojo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 10/414,226

(22) Filed: Apr. 16, 2003

(65) Prior Publication Data

US 2004/0109281 A1 Jun. 10, 2004

(30) Foreign Application Priority Data

Dec. 6, 2002 (JP) ........................................ 2002-355448

(51) Int. Cl.[7] ............................................. H01H 85/00
(52) U.S. Cl. ....................... 327/525; 327/526; 365/225.7
(58) Field of Search ................. 327/525, 526; 365/200, 201, 230.06, 225.7; 714/710, 711

(56) References Cited

U.S. PATENT DOCUMENTS 6,285,603 B1 * 9/2001 Ku et al. ................... 365/200
6,366,503 B2 * 4/2002 Sonoda .................. 365/189.05
6,704,228 B2 * 3/2004 Jang et al. .................. 365/200
6,819,607 B2 * 11/2004 Mukai et al. ............... 365/200

FOREIGN PATENT DOCUMENTS

| TW | 493176 | 7/2002 |
|---|---|---|
| TW | 511097 | 11/2002 |

OTHER PUBLICATIONS

U.S. Appl. No. 10/391,260, filed Mar. 19, 2003, Hojo et al.*

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

A semiconductor device includes a relief-subject circuit, a relief circuit, and a plurality of fuse elements. The relief-subject circuit implements a predetermined function. The relief circuit is provided to relieve the relief-subject circuit in order to implement the predetermined function. The plurality of fuse elements are provided corresponding to the relief circuit in order to replace the relief-subject circuit with the relief circuit, thus storing information to specify the relief-subject circuit when this relief-subject circuit is replaced by the relief circuit.

8 Claims, 12 Drawing Sheets

SEMICONDUCTOR DEVICE HAVING RELIEF CIRCUIT FOR RELIEVING DEFECTIVE PORTION

CROSS-REFERENCE TO RELATED APPLICATIONS

This application is based upon and claims the benefit of priority from the prior Japanese Patent Application No. 2002-355448, filed Dec. 6, 2002, the entire contents of which are incorporated herein by reference.

BACKGROUND OF THE INVENTION

1. Field of the Invention

The present invention relates generally to a semiconductor device having a relief circuit for relieving a defective portion and, more particularly, to one used in relieving by use of a fuse element.

2. Description of the Related Art

A semiconductor device has conventionally been provided with a relief circuit so that a defect, if any in the semiconductor circuit, may be replaced by the relief circuit.

A configuration of the conventional relief circuit is shown in FIG. 1. In this configuration there are provided a relief portion 102 to relieve a relief-subject section 101, and a fuse element 103, which corresponds to this relief portion 102. The fuse element 103 stores therein information to indicate, when a relief-subject section 101 is replaced by a relief portion 102, that the relief portion 102 is being used in replacement, and information to specify the relief-subject section 101 thus replaced.

Conventionally, however, only one fuse element 103 corresponds to each relief portion 102, so that a defect in the relief-subject section 101 can be replaced by the relief portion 102 only by using a relief method given by that fuse element 103. Therefore, there is a problem that a defect can be replaced by the relief portion 102 only in one of a plurality of evaluation steps.

Furthermore, it has conventionally been impossible to confirm, by an evaluation apparatus (tester), whether a defect is already replaced by the relief portion 102. That is, before replacement with the relief portion 102 in accordance with an evaluation result in an evaluation step, it is impossible to directly confirm through the evaluation apparatus whether the relief portion 102 is already used. Therefore, once a defect is replaced by the relief portion 102 in a semiconductor device, another defect, if any, that needs to be replaced by the relief portion 102 in accordance with an evaluation result, cannot easily be done so because the fuse element 103 which has been used in the first replacement with the relief portion 102 cannot be confirmed, which is a problem (see FIG. 2).

BRIEF SUMMARY OF THE INVENTION

A semiconductor device according to one aspect of the present invention comprises:

a relief-subject circuit which implements a predetermined function;

a relief circuit which is provided to relieve the relief-subject circuit, the relief circuit implementing the predetermined function; and a plurality of fuse elements which are provided corresponding to the relief circuit in order to replace the relief-subject circuit with the relief circuit, the plurality of fuse elements storing information to specify the relief-subject circuit when the relief-subject circuit is replaced by the relief circuit.

DETAILED DESCRIPTION OF THE INVENTION

Figure 1:
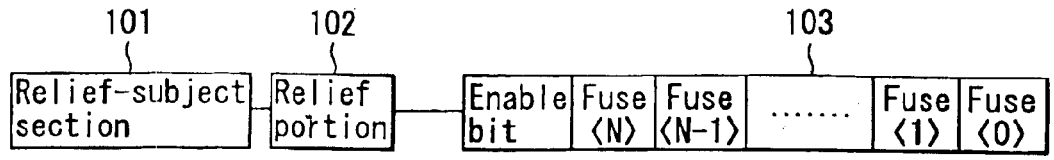
FIG. 1 is a diagram outlining a configuration of a conventional relief circuit.
Figure 2:
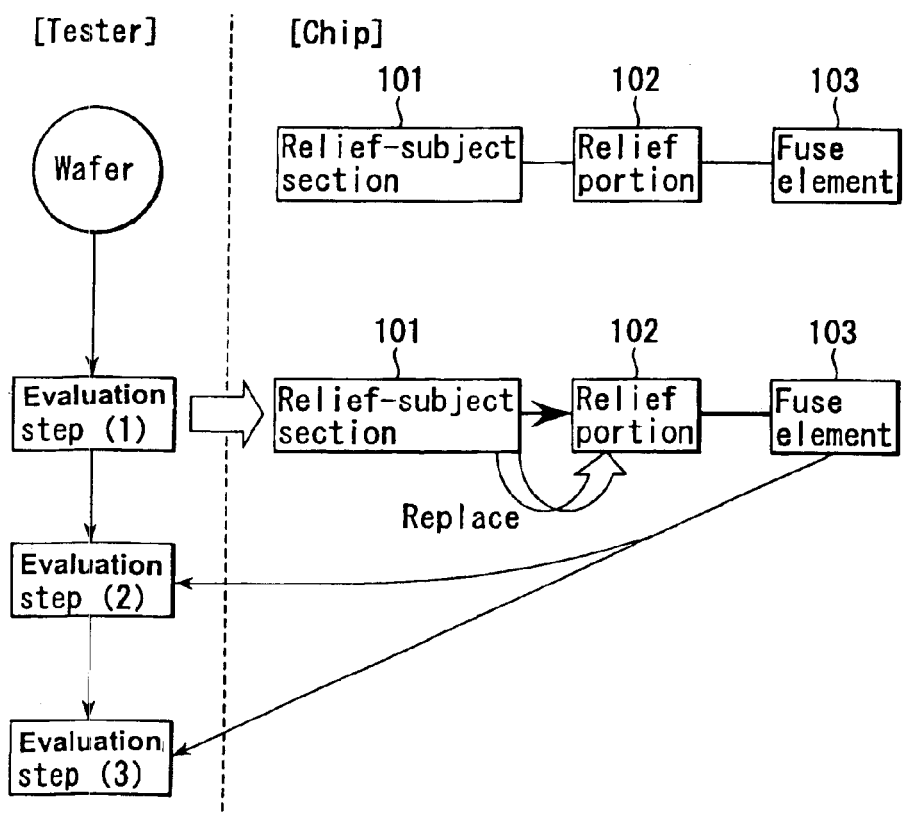
FIG. 2 is a diagram showing a flow of a relief method in the conventional relief circuit.

The following describes embodiments of the present invention with reference to the drawings. In the description, the same components are indicated by the same reference numerals in all the drawings.

First Embodiment

First, a semiconductor device according to the first embodiment of the present invention is described.

Figure 3:
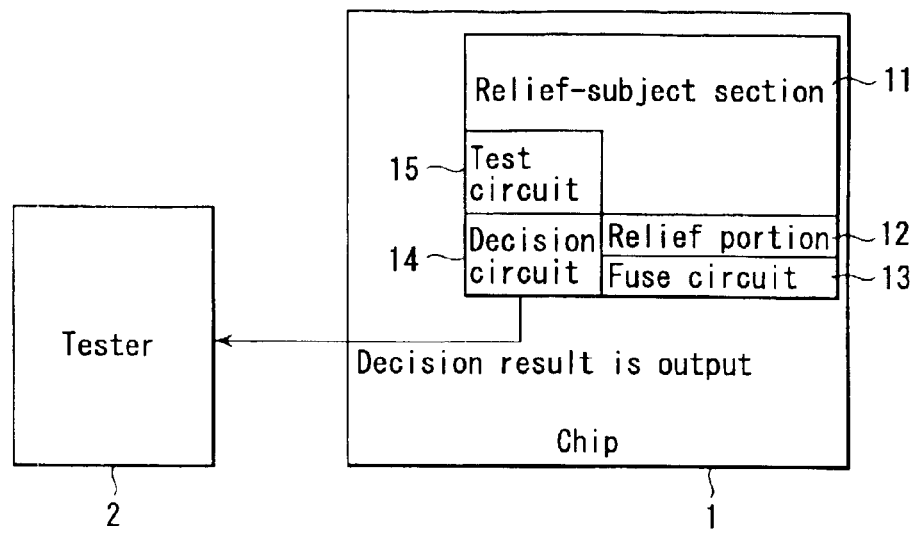
FIG. 3 is a diagram outlining a configuration of a semiconductor device according to a first embodiment of the present invention, and an evaluation apparatus.

FIG. 3 is a diagram outlining a configuration of the semiconductor device according to the first embodiment, and an evaluation apparatus.

As shown in FIG. 3, a semiconductor device (chip) 1 comprises a relief-subject section 11, a relief portion 12, a fuse circuit 13, a decision circuit 14, and a test circuit 15. The relief-subject section 11 includes a circuit for implementing a predetermined function, for example, memory cells or a word line and a column line which constitute a DRAM. The relief portion 12 is a circuit portion to replace a defect, if any, in the relief-subject section 11. The fuse portion 13 stores therein information to indicate, when a defect in the relief-subject section 11 is replaced by the relief portion 12, that the relief portion 12 is being used in replacement and information to specify the defect in the relief-subject section 11 which has been replaced. The decision circuit 14 decides whether the relief portion 12 and the corresponding fuse circuit 13 are being used in replacement or the relief portion 12 can be used in replacement. The test circuit 15 outputs a selection signal which is used to select a fuse element which is decided at the decision circuit 14. In this configuration, a result of decision by the decision circuit 14 is output to the evaluation apparatus (tester) 2.

Figure 4:
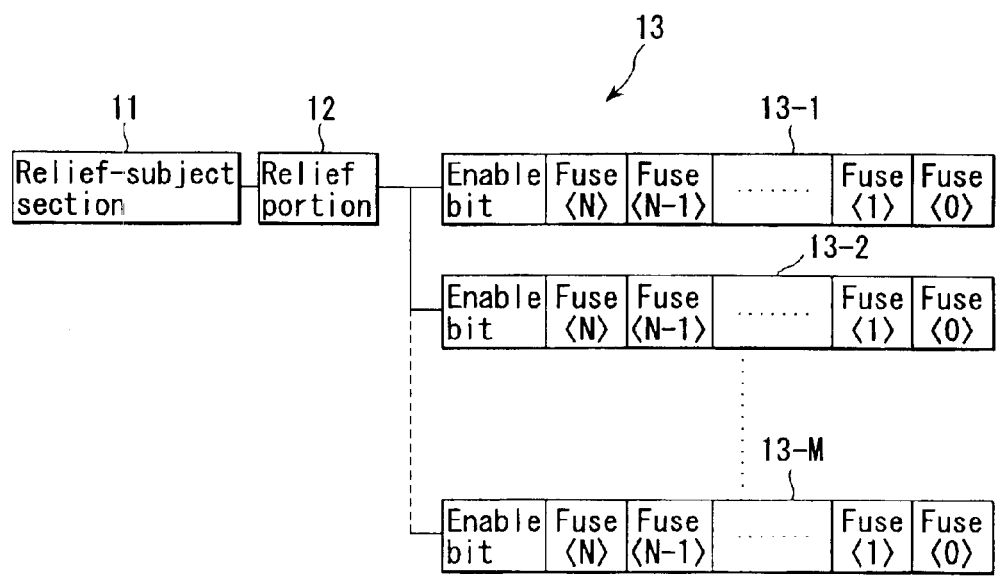
FIG. 4 is a diagram outlining a main part in the semiconductor device according to the first embodiment.

FIG. 4 is a diagram showing a configuration of the relief-subject section 11, the relief portion 12, and the fuse circuit 13 in the semiconductor device according to the first embodiment.

As shown in FIG. 4, the relief portion 12 for relieving the relief-subject section 11 is provided with the fuse circuit 13 which corresponds to this relief portion 12. The fuse circuit 13 is made up of a plurality of fuse elements 13-1, 13-2, ..., 13-M (M=2, 3, ..., M). That is, the plurality of fuse elements 13-1 through 13-M commonly have the relief portion 12. The plurality of fuse elements 13-1 through 13-M each have a one-bit fuse (ENABLE bit) which stores information which indicates, when a defect in the relief-subject section 11 is replaced by the relief portion 12, that the relief portion 12 is being used in replacement and an (n+1)-bit fuse (Fuse<0:N>) which stores information to specify the defect in the relief-subject section 11.

Figure 5:
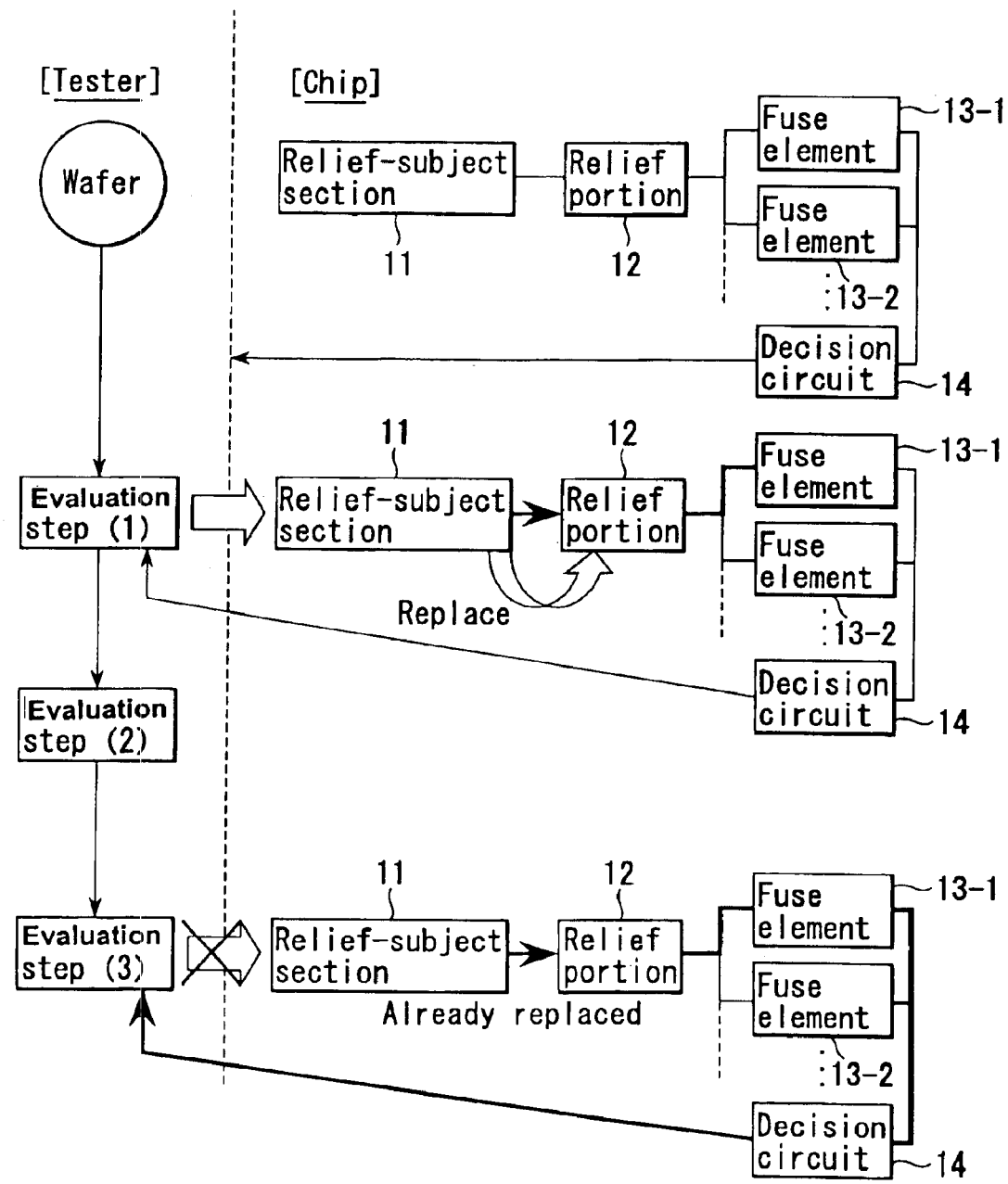
FIG. 5 is a diagram showing a flow of a relief method in the semiconductor device according to the first embodiment.
Figure 6:
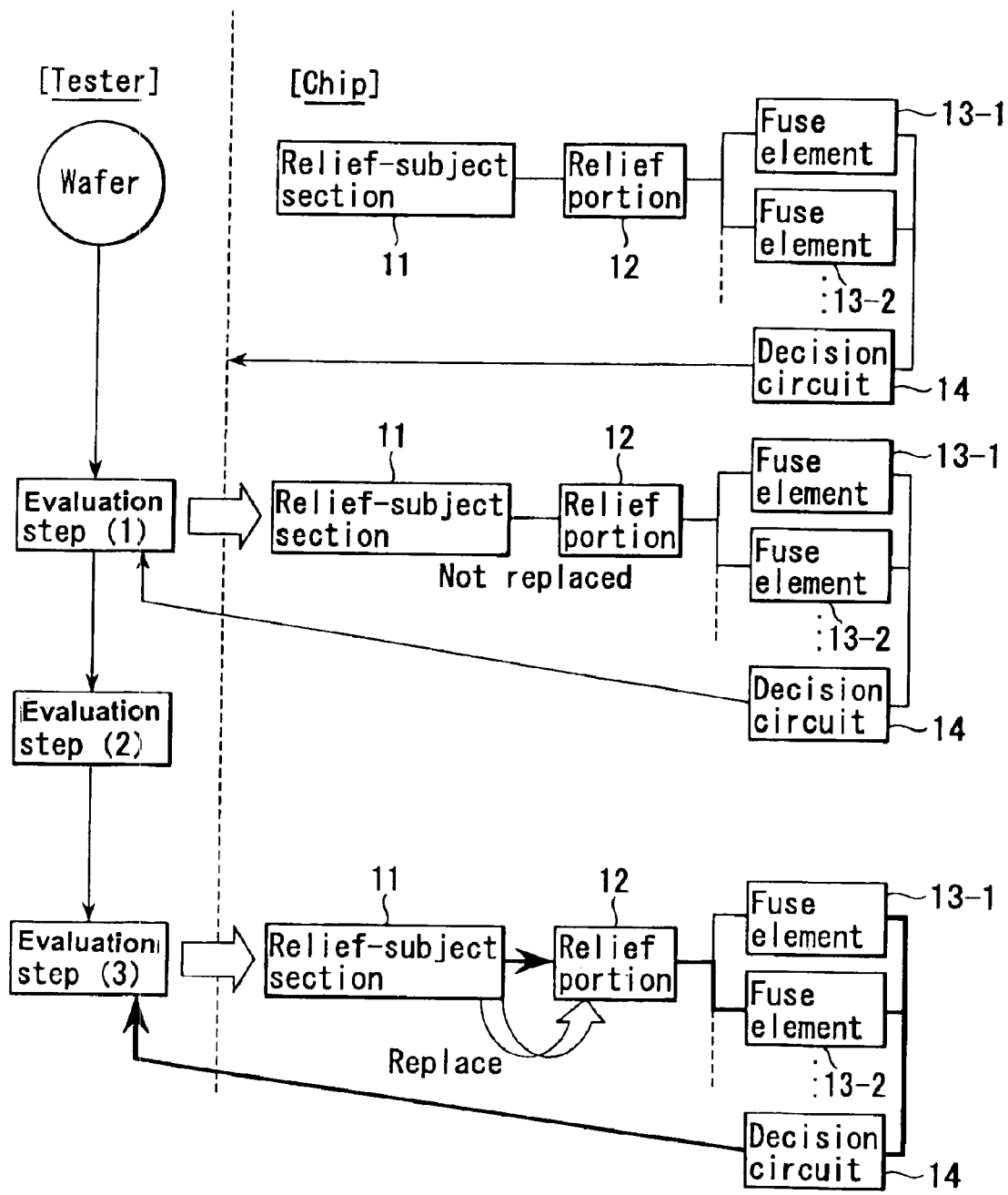
FIG. 6 is a diagram showing a flow of another relief method in the semiconductor device according to the first embodiment.

Next, flows of relief methods in the semiconductor device according to the first embodiment are shown in FIGS. 5 and 6.

As shown in FIG. 5, in the semiconductor device on a wafer are formed the relief-subject section 11, the relief portion 12, the fuse elements 13-1 through 13-M, and the decision circuit 14. Then, the relief-subject section 11 is evaluated through evaluation steps (1), (2), and (3) in this order in a process of manufacturing the semiconductor device.

First, in evaluation step (1), the relief-subject section 11 is evaluated. In this evaluation step (1), a defect, if any, in a relief-subject section is replaced by a relief portion 12. This triggers the process to store, in a fuse element 13-1 which corresponds to the relief portion 12, the information which indicates that the relief portion 12 is being used in replacement, and the information to specify the defect in the relief-subject section 11 which has been replaced.

Then, in evaluation steps (2) and (3), the relief-subject section 11 is evaluated again. In this evaluation step (3), if a defect still exists in the relief-subject section 11, it cannot be replaced by the relief portion 12 which has used the fuse element 13-1 because it is already used in the previous replacement. In the present embodiment, based on the information (ENABLE bit) stored in the fuse element 13-1, the decision circuit 14 decides whether the relief portion 12 is already used in replacement, and the decision result is output to the tester 2.

It is thus possible to confirm the relief portion 12 which has been used in replacement in evaluation step (1), thus efficiently replacing a defect in the relief-subject section 11 with a relief portion which is yet to be used.

FIG. 6 shows a case where no defect is present in a relief-subject section 11 in the above-mentioned evaluation step (1) and no replacement with the relief portion 12 is executed. In this case, in the following evaluation step (3), it can be decided using the decision circuit 14 that the relief portion 12 is yet to be used in replacement. It is thus possible to efficiently replace a defect in a relief-subject section 11 with a relief portion yet to be used.

As described above, in the present first embodiment, a plurality of fuses commonly have the relief portion, thus enabling relieving a defect present in a relief-subject section using a plurality of relief methods. It is thus possible to improve a ratio (relief ratio) at which a defect found at the time of evaluation can be relieved.

Furthermore, since a plurality of fuse elements commonly have a relief portion, it is not necessary to have a plurality of relief portions, thus suppressing an increase in area of the semiconductor device (chip).

Furthermore, in a case where there are a plurality of evaluation steps to be executed, that is, a defect is replaced by a relief portion two or more times, it is possible, using the tester, to confirm, in the second-time replacement step, which one of the relief portions has been used in the first-time replacement step, based on an output of the decision circuit. It is thus possible to easily decide whether the second-time replacement is possible. As a result, it is possible to reduce the time required in the second-time replacement and the subsequent replacements.

Furthermore, since it is possible, using the decision circuit, to decide a fuse element which has been used for replacement of a defect in a relief-subject section with a relief portion, it is possible using the tester to easily confirm which one of the fuse elements has been used in replacement. It is thus possible to reduce analysis time in evaluation even if a defect is present in the relief portion.

Second Embodiment

The following will describe a semiconductor device according to the second embodiment of the present invention. In the following, a specific example is described in detail in which the relief-subject section 11 in the above-mentioned semiconductor device in the first embodiment is a word line.

Figure 7:
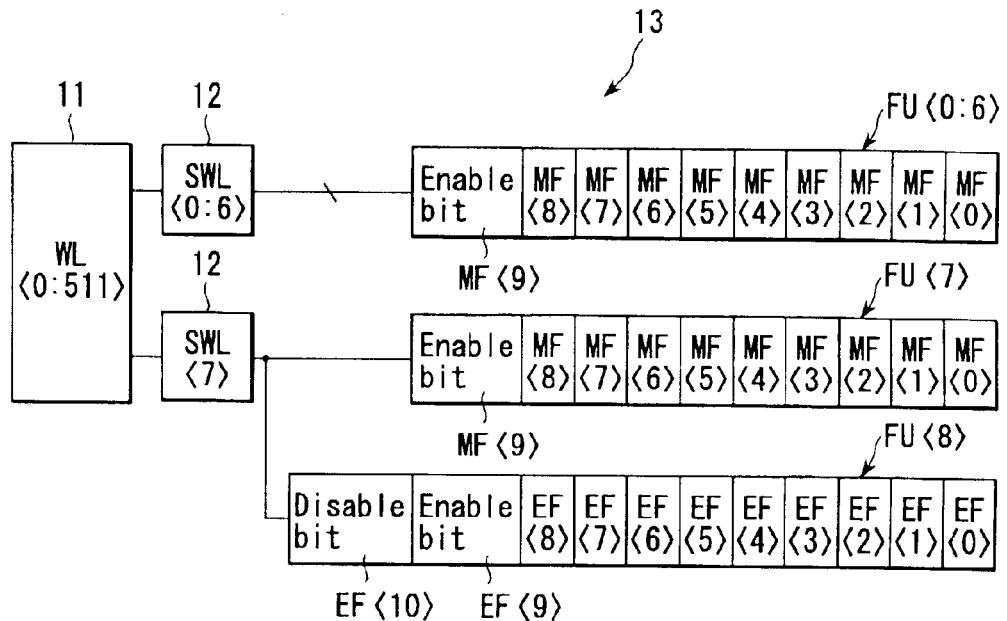
FIG. 7 is a diagram outlining a configuration of a main part in a semiconductor device according to a second embodiment of the present invention.

FIG. 7 is a diagram showing a configuration of a relief-subject section 11, a relief portion 12, and a fuse circuit 13 in the semiconductor device according to the second embodiment.

As shown in FIG. 17, it is assumed that a relief-subject section 11 is comprised of word lines WL0, WL1, ..., WL511 (hereinafter written as WL<0:511>) and a relief portion 12 for relieving word lines WL<0:511>is comprised of spare word lines SWL0, SWL1, ..., SWL7 (hereinafter written as SWL<0:7>). Each of the spare word lines SWL<0:6> is provided with fuse elements FU0, FU1, ..., FU6 (hereinafter written as FU<0:6>).

Each of the fuse elements FU<0:6> has 10-bit metal fuses MF0, MF1, ..., MF9 (hereinafter written as MF<0:9>) made of a metal. Metal fuses MF<0:8> of metal fuses MF<0:9> store an address of a defective word line of word lines WL<0:511>, while metal fuse MF<9> provides an ENABLE bit which stores information to indicate whether spare word lines SWL<0:6>, which correspond to these fuse elements FU<0:6> respectively, are being used.

Spare word line SWL<7> is provided with fuse elements FU<7> and FU<8>. That is, fuse elements FU<7> and FU<8> commonly have spare word line SWL<7>.

Fuse element FU<7> has 10-bit metal fuses MF<0:9> made of a metal. Metal fuses MF<0:8> of metal fuses MF<0:9> store an address of a defective word line of word lines WL<0:511>. Metal fuse MF<9> provides an ENABLE bit which stores information to indicate whether spare word line SWL<7>, which corresponds to this fuse element FU<7>, is being used.

Fuse element FU<8> has 11-bit electrical fuses EF0, EF1, ..., EF10 (hereinafter written as EF<0:10>). Electrical fuses EF<0:8> of electrical fuses EF<0:10> store an address of a defective word line of word lines WL<0:511>. Electrical fuse EF<9> provides an ENABLE bit which stores information which indicates whether space word line SWL<7> which corresponds to this fuse FU<8> is being used. Furthermore, electrical fuse EF<10> provides a DISABLE bit which stores information to indicate whether spare word line SWL<7> itself has a defect.

Furthermore, in spare word line SWL<7>, the ENABLE bits of respective fuse elements FU<7> and FU<8> are utilized in order to indicate which one of fuse element FU<7>, comprised of metal fuses, and fuse element FU<8> comprised of electrical fuses, is being used in replacement.

The above-mentioned metal fuse is made of almost the same material as that of a wiring line in the chip. This metal fuse, when the above-mentioned wiring line is disconnected by laser, stores information. It is thus possible to record information by disconnecting wiring lines on the wafer, but, after the chip is packaged (after assembly), the wiring line cannot be disconnected, therefore, information cannot be recorded. The electrical fuse is made of an element that can be disconnected electrically or short-circuited electrically. This electrical fuse stores information when an external high voltage is applied to the element to disconnect or short-circuit it. It is therefore possible to record information by disconnecting or short-circuiting the element whether the chip is still on the wafer or already packaged.

In a case where a defect is present in any of word lines WL<0:511> in the semiconductor device having the above-mentioned configuration, up to seven defective word lines can be replaced by respective spare word line SWL<0:6> using fuse elements FU<0:6> comprised of metal fuses. Spare word line SWL<7> can be introduced in place of defective word lines WL using fuse element FU<7> comprised of metal fuses or fuse element FU<8> comprised of electrical fuses.

Next, the decision circuit 14 the semiconductor device of the second embodiment.

Figure 8:
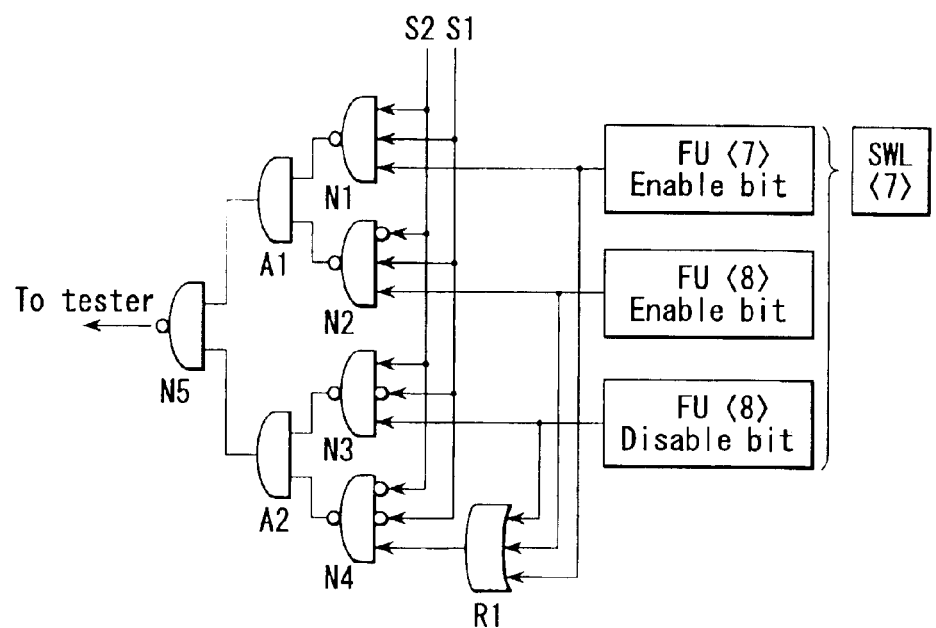
FIG. 8 is a circuit diagram showing a configuration of a decision circuit provided in the semiconductor device according to the second embodiment.

FIG. 8 is a circuit diagram showing a configuration of the decision circuit provided in the above-mentioned semiconductor device according to the second embodiment is described. This decision circuit 14 decides whether fuse element FU<7> or FU<8> is being used or not or whether it can be used or not. It is to be noted that almost the same configuration can be used also to decide whether fuse elements FU<0:6> are being used.

As shown in FIG. 8, to the respective first input terminals of OR circuit R1 and NAND circuit N1 is input information which is stored at the ENABLE bit of fuse FU<7>. To the second input terminal of OR circuit R1 and the first input terminal of NAND circuit N2 is input information which is stored at the ENABLE bit of fuse element FU<7>. To the third input terminal of OR circuit R1 and the first input terminal of NAND circuit N3 is input information which is stored at the DISABLE bit of fuse element FU<8>. Furthermore, the output signal of the OR circuit R1 is input to the first input terminal of NAND circuit N4.

The output signals of the above-mentioned NAND circuits N1 and N2 are input to the first and second input terminals of AND circuit A1 respectively. The output signals of the above-mentioned NAND circuits N3 and N4 are input to the first and second input terminals of AND circuit A2 respectively. Furthermore, the output signals of AND circuits A1 and A2 are input to the first and second input terminals of NAND circuit N5 respectively. Then, the output signal of NAND circuit N5 is input to a tester 2.

To the respective second input terminals of the above-mentioned NAND circuits N1–N4 is input SELECT signal S1 output from a test circuit 15, while to the respective third input terminals of NAND circuits N1–N4 is input SELECT signal S2 output from the test circuit 15.

In the decision circuit having such a configuration, if SELECT signals (S1, S2) are (1, 1), it is decided whether the ENABLE bit of fuse element FU<7> is "1" or "0". If, in this case, the ENABLE bit is "1", it is indicated that spare word line SWL<7> is being used using fuse element FU<7> and, if the ENABLE bit is "0", it is indicated that fuse FU<7> is not being used. If the ENABLE bit of fuse FU<7> is "1" and SELECT signals (S1, S2) are (1, 1), "1" is output from the output terminal of NAND circuit N5 to the tester 2. Therefore, when "1" is output to the tester 2, it is possible to decide that spare word line SWL<7> is being used using fuse element FU<7>.

If SELECT signals (S1, S2) are (1, 0), on the other hand, it is decided whether the ENABLE bit of fuse FU<8> is "1" or "0". If, in this case, the ENABLE bit is "1", it is indicated that spare word line SWL<7> is being used using fuse FU<8> and, if the ENABLE bit is "0", it is indicated that fuse element FU<8> is not being used. If the ENABLE bit of fuse element FU<8> is "1" and SELECT signals (S1, S2) are (1, 0), "1" is output from the output terminal of NAND circuit N5 to the tester 2. Accordingly, when "1" is output to the tester 2, it can be decided that spare word line SWL<7> is being used using fuse FU<8>.

If SELECT signals (S1, S2) are (0, 1), it is decided whether the DISABLE bit of fuse FU<8> is "1" or "0". If, in this case, the DISABLE bit is "1", it is indicated that a defect is present in spare word line SWL<7> itself and, if the DISABLE bit is "0", it is indicated that no defect is present in spare word line SWL<7>. If the DISABLE bit of fuse element FU<8> is "1" and SELECT signals (S1, S2) are (0, 1), "1" is output from the output terminal of NAND circuit N5 to the tester 2. Accordingly, when "1" is output to the tester 2, it can be decided that a defect is present in spare word line SWL<7> itself.

Furthermore, if SELECT signals (S1, S2) are (0, 0), it is decided whether at least one of the ENABLE bit of fuse element FU<7>, the ENABLE bit of fuse FU<8>, and the DISABLE bit of fuse FU<8> is "1". If at least one of them is "1" and SELECT signals (S1, S2) are (0, 0), "1" is output from the output terminal of NAND circuit N5 to the tester 2. Accordingly, when "1" is output to the tester 2, it can be decided that spare word line SWL<7> cannot be used in replacement.

As described above, by using the above-mentioned decision circuit 14, it is possible, when a defect is replaced by a relief portion in the evaluation step, to confirm whether the defect is already replaced by the relief portion using a fuse element, to confirm which one of the plurality of fuse elements has been used to replace the defect with the relief portion, and to confirm whether the relief portion itself can be used.

Figure 9:
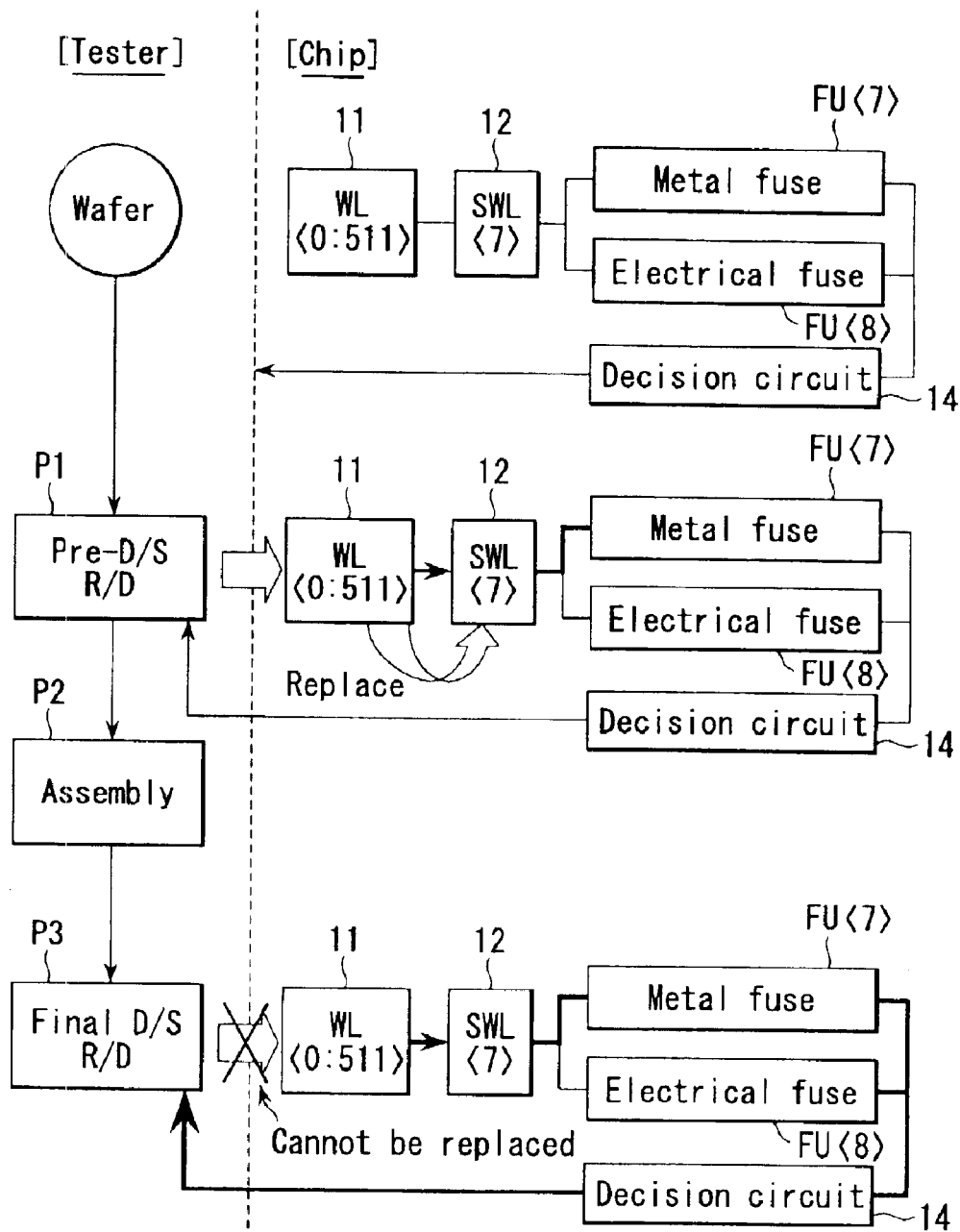
FIG. 9 is a diagram showing a flow of a first relief method in the semiconductor device according to the second embodiment.
Figure 10:
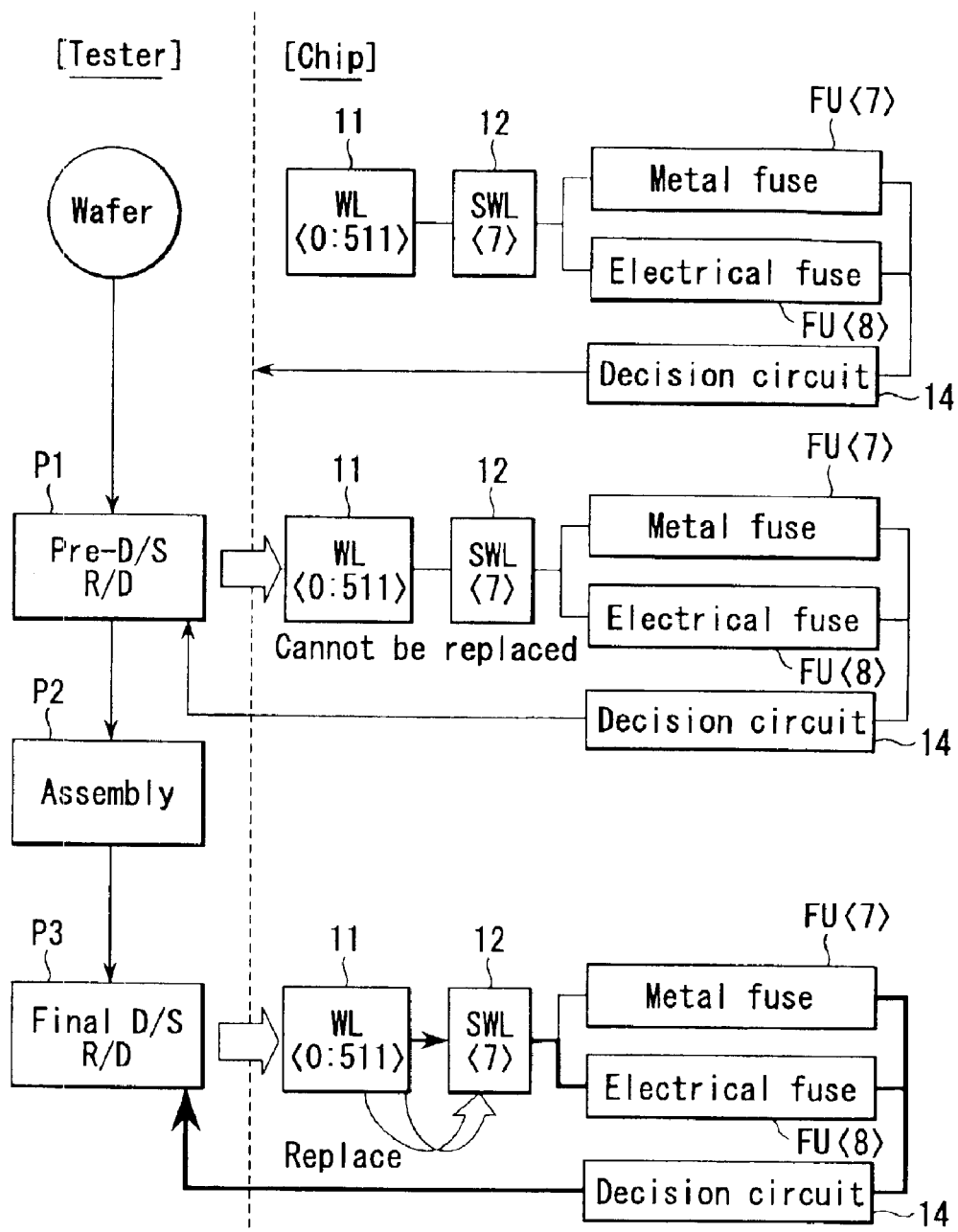
FIG. 10 is a diagram showing a flow of a second relief method in the semiconductor device according to the second embodiment.
Figure 11:
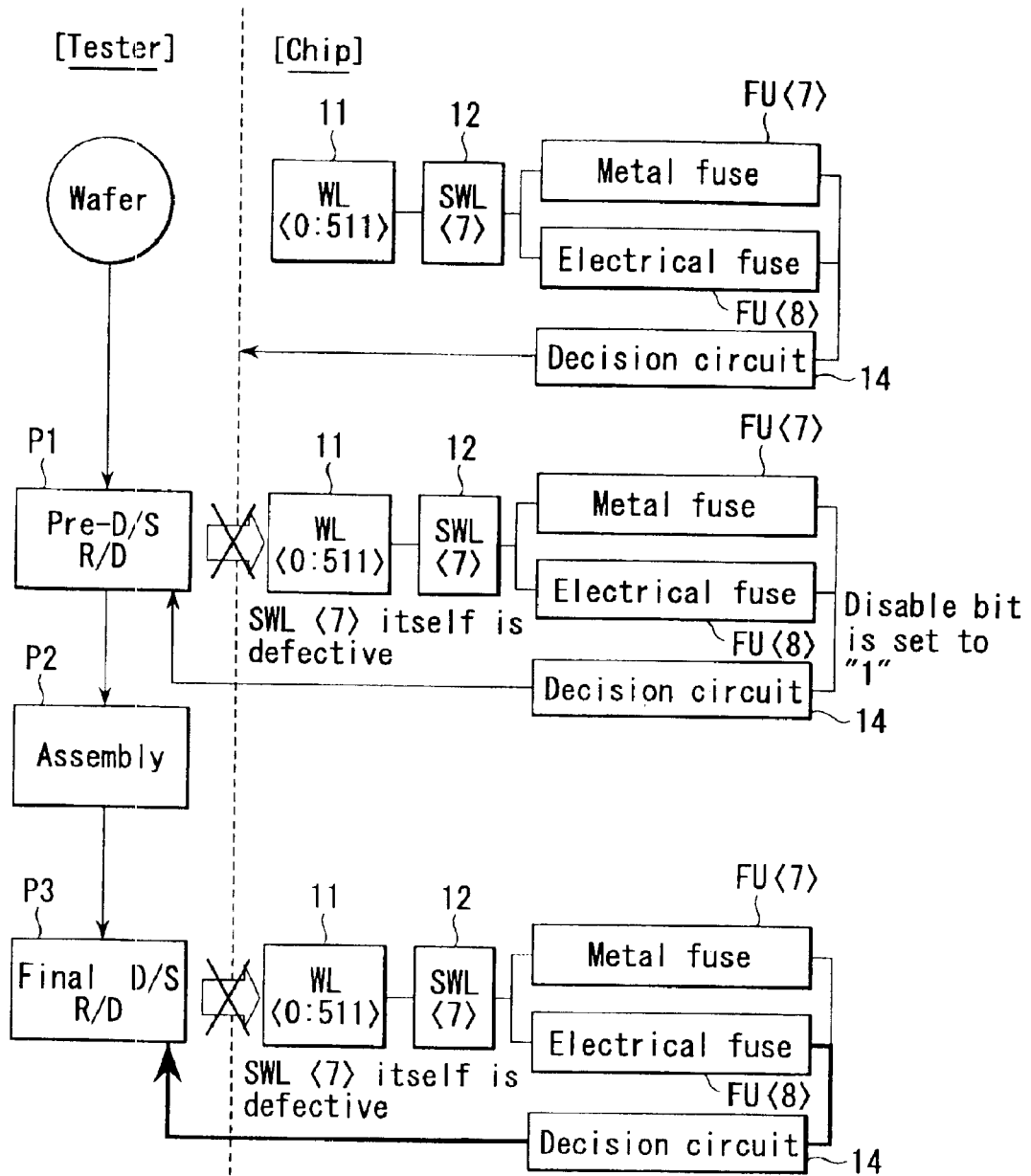
FIG. 11 is a diagram showing a flow of a third relief method in the semiconductor device according to the second embodiment.

The following will describe operations of the semiconductor device according to the second embodiment with reference to FIGS. 9, 10, and 11.

FIGS. 9, 10, and 11 are diagrams showing flows of relief methods in the above-mentioned semiconductor device.

As shown in FIG. 9, in the semiconductor device on the wafer are there are formed word lines WL<0:511> as the relief-subject section 11, spare word line SWL<7>as the relief portion 12, fuse elements FU<7> and FU<8>, and the decision circuit 14. Then, in a process for manufacturing the semiconductor device, the semiconductor device goes through a die sorting and relief step (Pre-D/S R/D) P1 which is the first evaluation step, an assembly step P2, and a die sorting and relief step (Final D/S R/D) P3 which is the second evaluation step, in this order.

First, in the first evaluation step P1, word lines WL<0:511> are evaluated. In this first evaluation step P1, if a defect is present in any word line of word lines WL<0:511>, the defective word line is replaced by spare word line SWL. In this case, spare word lines SWL of SWL<0> through SWL<7> are used in an ascending order in replacement. If, for example, eight word lines are defective, seven of them are replaced by spare word lines SWL<0:6> respectively and the eighth defective word line is replaced by spare word line SWL<7>. Correspondingly, fuse elements FU<0:7>, which correspond to spare word lines SWL<0:7>, respectively store therein information which indicates that spare word lines SWL<0:7> are being used in replacement, and information to specify the defective word lines thus replaced.

Then, in the second evaluation step P3 after the assembly step P2, word lines WL<0:511> are evaluated again. In this second evaluation step P3, if a defective word line is still present among word lines WL<0:511>, these defective word lines cannot be replaced by spare word line SWL<7> because spare word lines SWL<0:7> which use fuse elements FU<0:7> respectively are already used in replacement. It is to be noted that in the second evaluation step P3 after the assembly step, it is possible only to replace the defective word line with spare word line SWL<7> using fuse element <8> comprised of electrical fuses.

In the second evaluation step P3, based on the information stored in fuse elements FU<7> and FU<8>(ENABLE bit and DISABLE bit), it is decided using the decision circuit 14 whether spare word line SWL<7> is already used in replacement and whether spare word line SWL<7> itself has a defect, and the decision result is output to the tester 2. It is thus possible to confirm that SWL<7> is already used in replacement in the first evaluation step P1, thus deciding that the defective word line of word lines WL<0:511> cannot be replaced by spare word line SWL<7> in the second evaluation step P3.

FIG. 10 indicates a case where, in the above-mentioned first evaluation step P1, only seven defective word lines are present among word lines WL<0:511> and spare word line SWL<7> has not been used in replacement. In this case, in the following second evaluation step P3, the decision circuit 14 can decide that spare word line SWL<7> has not been used in replacement and whether spare word line SWL<7> itself has a defect. It is thus possible to efficiently replace a defective word line of word lines WL<0:511> with spare word line SWL<7> not used yet, in the second evaluation step P3.

FIG. 11 indicates a case where, in the above-mentioned first evaluation step P1, at least eight defective word lines are present among word lines WL<0:511> but spare word line SWL<7> cannot be used for replacement because it has a defect.

In the first evaluation step P1, if it is known that spare word line SWL<7> has a defect, "1" is recorded at the DISABLE bit of fuse element FU<8>. Specifically, a wiring line that corresponds to the DISABLE bit is disconnected by laser.

In such a manner, the decision circuit 14 can decide that spare word line SWL<7> has a defect based on the information recorded at the DISABLE bit in the following second evaluation step P3. Therefore, in the second evaluation step P3, it can be decided that a defective word line of word lines WL<0:511> cannot be replaced by spare word line SWL<7>.

It is thus possible to efficiently execute the relief methods for replacing a defective word line of word lines WL<0:511> with spare word line SWL<7> in the two evaluation steps before and after the assembly step respectively.

Figure 12:
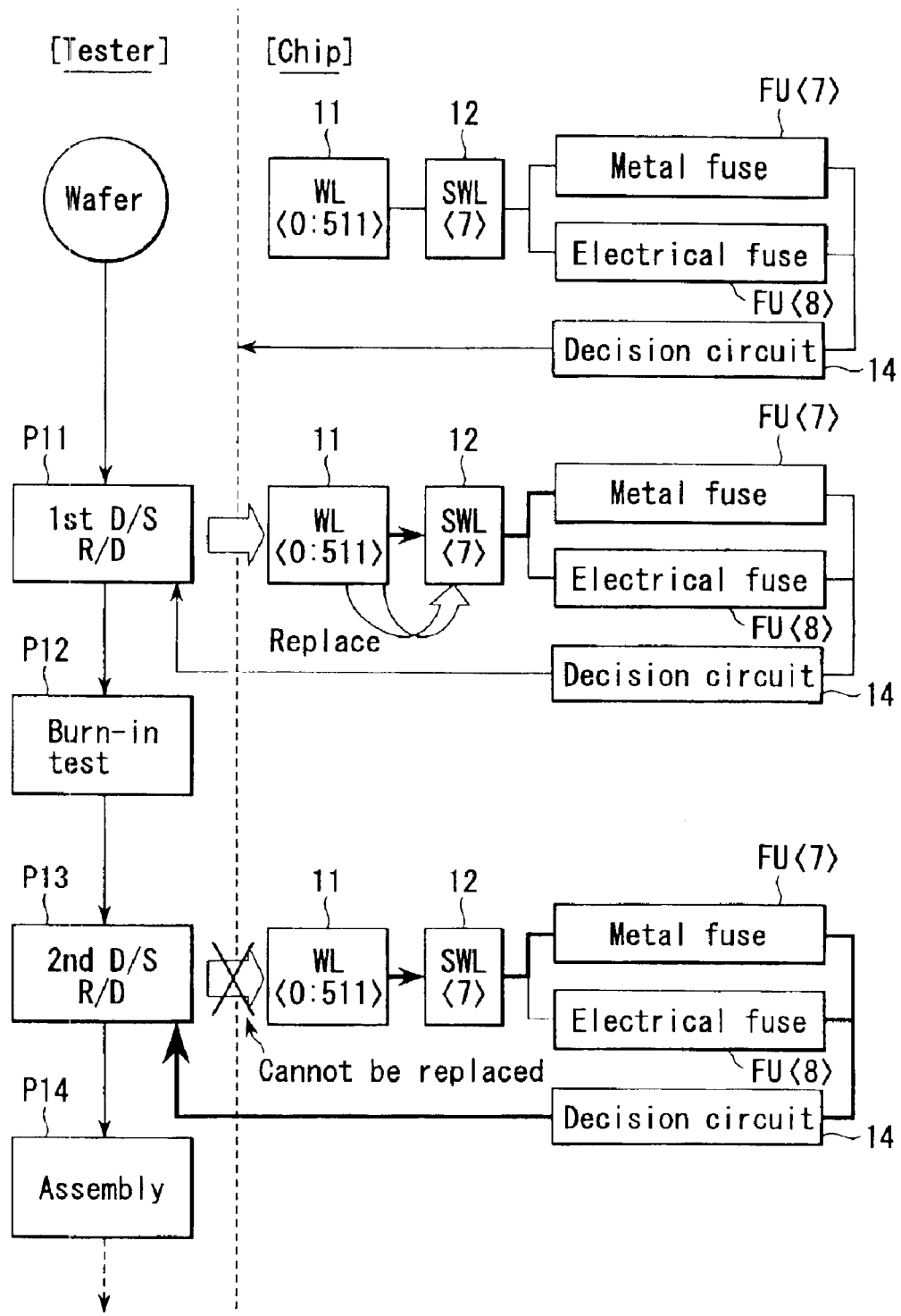
FIG. 12 is a diagram showing a flow of a fourth relief method in the semiconductor device according to the second embodiment.
Figure 13:
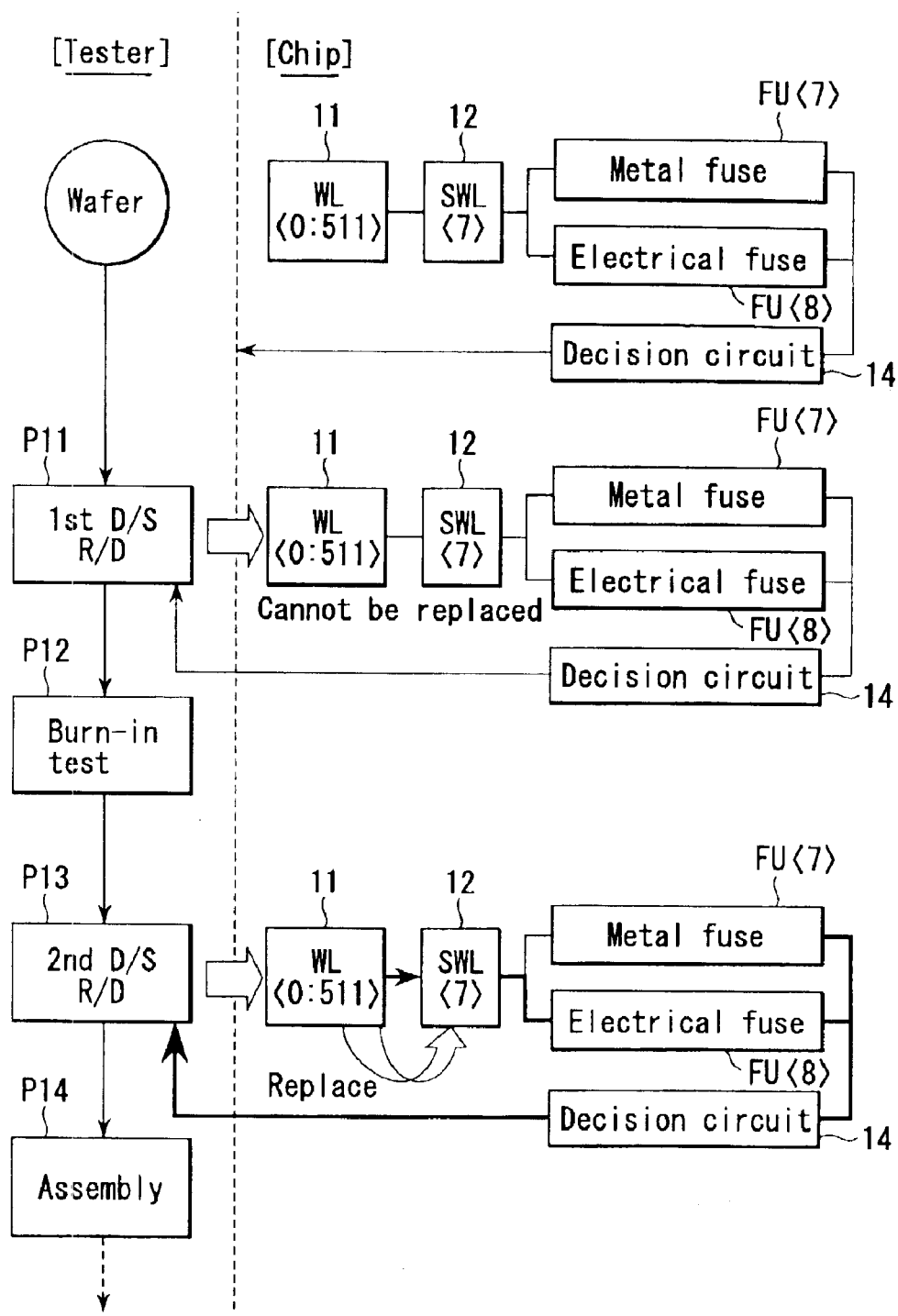
FIG. 13 is a diagram showing a flow of a fifth relief method in the semiconductor device according to the second embodiment.
Figure 14:
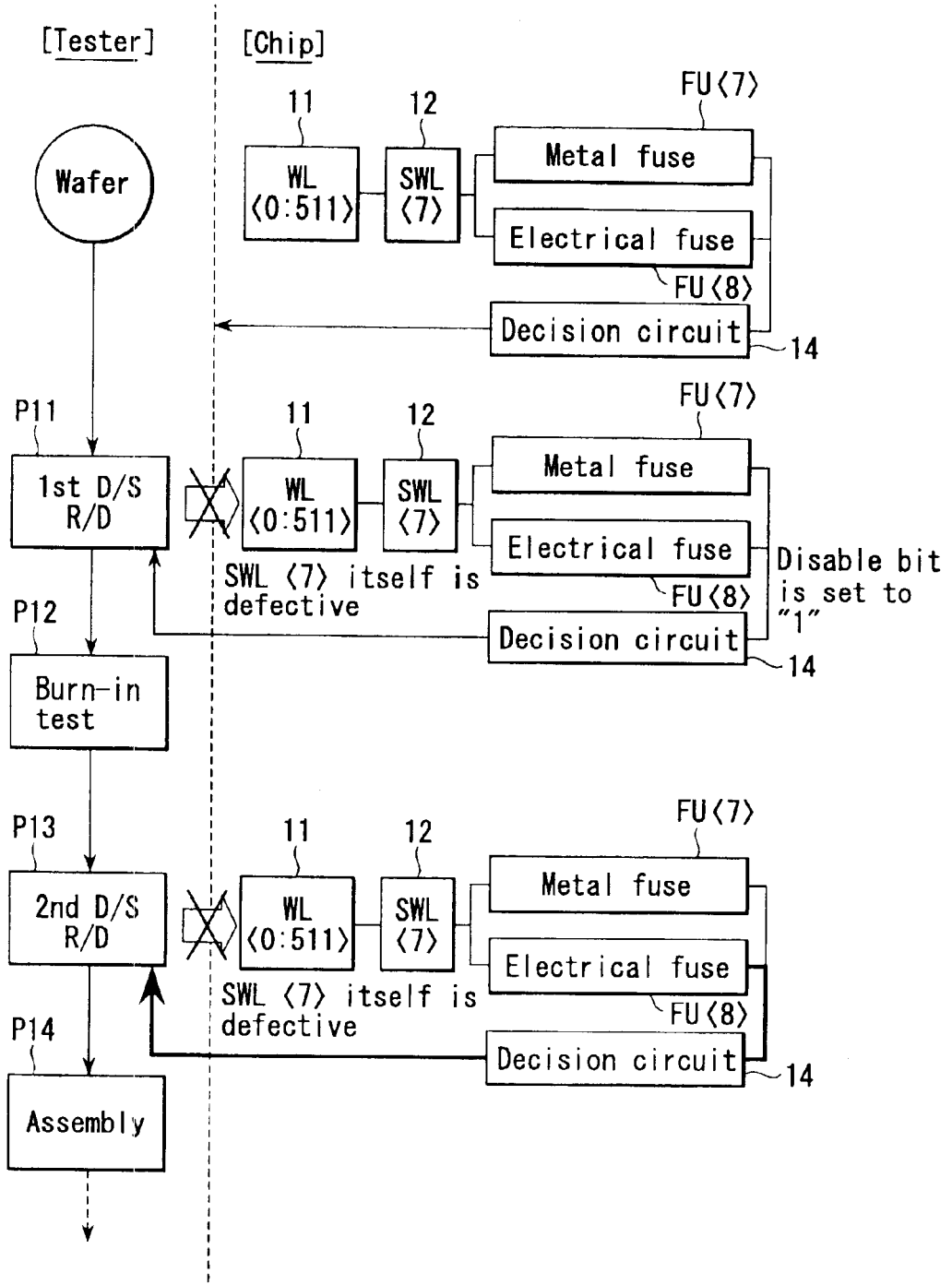
FIG. 14 is a diagram showing a flow of a sixth relief method in the semiconductor device according to the second embodiment.

Furthermore, FIGS. 12, 13, and 14 show a case where the first and second evaluation steps are executed on the semiconductor device on a wafer, that is, a case where before assembly and packaging, a relief step of replacing a defective word line with a spare word line is executed twice.

That is, in contrast to the example shown in FIGS. 9–11 where the first evaluation step is executed on the semiconductor device on the wafer and then, after assembly and packaging of the device, the second evaluation step is executed thereon, in an example shown in FIGS. 12–14, the first evaluation step is executed on the semiconductor device on the wafer as the first step and then, after burn-in testing and before assembly (packaging), the second evaluation step is executed as the second step.

FIGS. 12–14 show flows of other relief methods in the above-mentioned semiconductor device.

As shown in FIG. 12, in the semiconductor device on the wafer there are formed word lines WL<0:511> as the relief-subject section 11, spare word line SWL<7> as the relief portion 12, fuse elements FU<7> and FU<8>, and the decision circuit 14. Then, in a process for manufacturing the semiconductor device, the semiconductor device goes through a die sorting and relief step (Pre-D/S R/D) P11 which is the first evaluation step, a burn-in test P12, a die sorting and relief step (2'nd D/S R/D) P13 which is the second evaluation step, and an assembly step P14 in this order.

First, in the first evaluation step P11, word lines WL<0:511> are evaluated. In this first evaluation step P11, if a defect is present in any word line of word lines WL<0:511>, the defective word line is replaced by spare word line SWL. In this case, if eight word lines are defective, seven of them are replaced by spare word lines SWL<0:6> respectively, and the eighth defective word line is replaced by spare word line SWL<7>. Correspondingly, fuse elements FU<0:7>, which correspond to spare word lines SWL<0:7>, respectively store therein information which indicates that spare word lines SWL<0:7> are being used in replacement and information to specify the defective word line thus replaced.

Then, in the second evaluation step P13 after the burn-in test P12, word lines WL<0:511> are evaluated again. In this second evaluation step P13, if a defective word line is still present among word lines WL<0:511>, the defective word line cannot be replaced by spare word line SWL<7> because spare word lines SWL<0:6> which use fuse elements FU<0:6> and spare word lines SWL<0:7> which use fuse element FU<7> are already used in replacement.

In the second evaluation step P13, based on the information stored in fuse elements FU<7> and FU<8> (ENABLE bit and DISABLE bit), it is decide using the decision circuit 14 whether spare word line SWL<7> is already used in replacement and whether spare word line SWL<7> itself has a defect, and the decision result is output to the tester 2. It is thus possible to confirm that SWL<7> is already used in replacement in the first evaluation step P11, thus deciding that the defective word line of word lines WL<0:511> cannot be replaced by spare word line SWL<7> in the second evaluation step P13.

FIG. 13 indicates a case where, in the above-mentioned first evaluation step P11, only seven defective word lines are present among word lines WL<0:511> and spare word line SWL<7> has not been used in replacement. In this case, in the following second evaluation step P13, it can be decided using the decision circuit 14 that spare word line SWL<7> has not been used in replacement and whether spare word line SWL<7> itself has a defect. It is thus possible to efficiently replace a defective word line of word lines WL<0:511> with spare word line SWL<7> not used yet, in the second evaluation step P13.

It is to be noted that in the second evaluation step P13 before the assembly step, it is possible to replace the defective word line with spare word line SWL<7> whether fuse element FU<7> comprised of metal fuses or fuse element <8> comprised of electrical fuses is used.

FIG. 14 indicates a case where, in the above-mentioned first evaluation step P11, at least eight defective word lines are present among word lines WL<0:511> but spare word line SWL<7> cannot be used for replacement because it has a defect.

In this case, "1" is recorded at the DISABLE bit of fuse element FU<8> beforehand in the first evaluation step P11.

In such a manner, it is possible, using the decision circuit 14, to decide that spare word line SWL<7> has a defect, based on the information recorded at the DISABLE bit, in the following second evaluation step P13. Accordingly, it is possible to know that a defective word line of word lines WL<0:511> cannot be replaced by spare word line SWL<7>.

It is thus possible to efficiently execute the relief methods for replacing a defective word line of word lines WL<0:511> with spare word line SWL<7> in the two evaluation steps before and after the assembly step respectively.

In this second embodiment, by permitting a fuse element comprised of metal fuses and a fuse element comprised of electrical fuses to commonly have the spare word line, it is possible to relieve a defective word line by a plurality of methods, such as disconnecting the wiring line by means of laser application, or disconnecting the element by means of applying a high voltage. It is thus possible to improve a ratio (relief ratio) at which a defective word line found during evaluation can be relieved.

Furthermore, since a fuse element comprised of metal fuses and a fuse element comprised of electrical fuses commonly have a spare word line, it is not necessary to have a plurality of spare word lines, thus enabling suppressing an increase in area of the semiconductor device (chip).

Furthermore, in a case where at least two steps of a plurality of evaluation steps are provided for replacing a defective word line with a spare word line, in the second replacement step it is possible to confirm, using a tester, which one of the spare word lines has been used in the first replacement step, based on an output of the decision circuit. It is thus possible to easily decided whether the second replacement is possible. As a result, it is possible to reduce the time required to execute the second replacement and subsequent replacements.

Furthermore, it is possible to decide which one of the fuse elements is being used in replacement of a defective word line with a spare word line, so that it is possible, using the tester, to easily confirm which one of the fuse elements is being used in replacement in the evaluation step. It is thus possible to reduce analysis time in evaluation even if a spare word line has a defect.

Third Embodiment

The following describes a semiconductor device according to the third embodiment of the present invention. In contrast to an example of the second embodiment shown in FIG. 7 in which one relief portion (spare word line SWL<7>) 12 is provided with a fuse element FU<7> comprised of metal fuses and a fuse element FU<8> comprised of electrical fuses, in an example of the third embodiment, one relief portion is provided with a fuse element comprised of metal fuses, while the other relief portion is provided with a fuse element comprised of electrical fuses.

Figure 15:
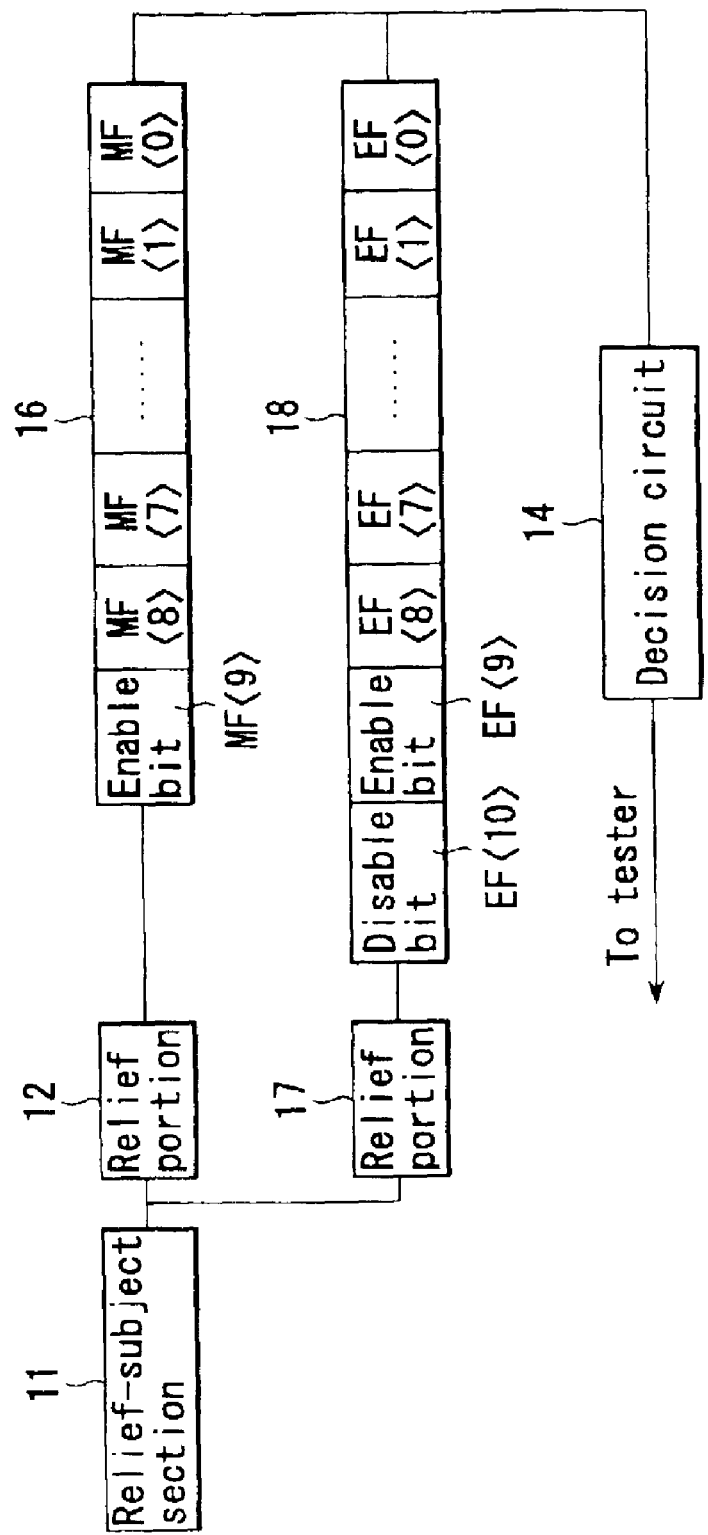
FIG. 15 is a diagram outlining a main part in a semiconductor device according to a third embodiment of the present invention.

FIG. 15 is a diagram showing a configuration of a relief-subject section, a relief portion, a fuse circuit, and a decision circuit in the semiconductor device according to the third embodiment.

As shown in FIG. 15, the relief portion 12 for relieving a defect in the relief-subject section 11 is provided with a fuse element 16 which corresponds to this relief portion 12 and is comprised of metal fuses. A relief portion 17 for relieving a defect in the relief-subject section 11, on the other hand, is provided with a fuse element 18 which corresponds to thus relief portion 17 and is comprised of electrical fuses. Furthermore, there is provided a decision circuit 14 for deciding whether the relief portions 12 and 17 are being used in replacement.

The above-mentioned fuse element 16 has 10-bit metal fuses MF<0:9>. Metal fuses MF<0:8> of metal fuses MF<0:9> store therein the information to specify a defect in a relief-subject section 11. Metal fuse MF<9> provides an ENABLE bit which stores information which indicates whether a relief portion 12 which corresponds to this fuse element 16 is being used in replacement.

The above-mentioned fuse element 18 has 11-bit electrical fuses EF<0:10>. Electrical fuses EF<0:8> of electrical fuses EF<0:10> store therein the information to specify a defect in a relief-subject section 11. Electrical fuse EF<9> provides an ENABLE bit which stores information which indicates whether a relief portion 17 which corresponds to this fuse element 18 is being used in replacement. Electrical fuse EF<10>, on the other hand, provides a DISABLE bit which stores information which indicates whether the relief portion 17 has a defect in itself.

It is to be noted that although FIG. 15 shows one relief portion provided with a fuse element comprised of metal fuses and another relief portion provided with a fuse element comprised of electrical fuses, there may be provided a plurality of relief portions, each provided with a fuse element comprised of metal fuses or a plurality of relief portion provided with a fuse element comprised of electrical fuses. Furthermore, more than one of each relief portion may be provided.

In this third embodiment, besides the relief portion provided with the fuse element comprised of metal fuses, there is also provided the relief portion provided with the fuse element comprised of electrical fuses. Accordingly, even after assembly (after packaging), a defect in a relief-subject section can be replaced by the relief portion provided with the fuse element comprised of electrical fuses. This improves the relief ratio of defects at the time of evaluation.

Furthermore, there is provided a decision circuit for deciding whether the relief portion is being used in replacement, so that it is possible in the second and subsequent evaluations to efficiently replace a defect in a relief-subject section with the relief portion.

As described above, according to the embodiments of the present invention, a plurality of fuse elements can commonly have a relief portion, so that a defect can be easily replaced by a relief portion during evaluation, thus providing a semiconductor device which can further improve the relief ratio of the defects.

It is to be noted that the above-mentioned embodiments can be implemented not only alone but also in appropriate combination. Furthermore, the above-mentioned embodiments include a variety of phases of the present invention, and a plurality of components disclosed in each of these embodiments can be combined appropriately to extract these various phases of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a relief-subject circuit which implements a predetermined function;
   a relief circuit which is provided to relieve the relief-subject circuit, the relief circuit implementing the predetermined function; and
   a plurality of fuse elements which are provided corresponding to the relief circuit in order to replace the relief-subject circuit with the relief circuit, the plurality of fuse elements storing information to specify the relief-subject circuit when the relief-subject circuit is replaced by the relief circuit, each of the plurality of fuse elements having a plurality of bits which store information, the plurality of bits including a bit which indicates that the relief-subject circuit is already replaced by the relief circuit using the fuse elements.

2. The semiconductor device according to claim 1, wherein the plurality of bits include a bit which indicates that the relief circuit is defective.

3. The semiconductor device according to claim 2, wherein the bit which indicates that the relief circuit is defective is included in any one fuse element of the plurality of fuse elements.

4. The semiconductor device according to claim 1, further comprising a decision circuit which decides whether the relief-subject circuit is already replaced by the relief circuit using the fuse element.

5. The semiconductor device according to claim 1, further comprising a decision circuit which decides which fuse element of the plurality of fuse elements has been used to replace the relief-subject circuit with the relief circuit.

6. The semiconductor device according to claim 1, further comprising a decision circuit which decides whether the relief circuit is defective.

7. The semiconductor device according to claim 1, wherein the plurality of fuse elements include metal fuses which store information which is obtained by disconnecting the metal fuse by laser.

8. The semiconductor device according to claim 1, wherein the plurality of fuse elements include electrical fuses which store information which is obtained by disconnecting the electrical fuse electrically by voltage application.

* * * * *